(12) United States Patent
Sills et al.

(10) Patent No.: US 9,548,286 B2
(45) Date of Patent: Jan. 17, 2017

(54) SOLID STATE LIGHTS WITH THERMAL CONTROL ELEMENTS

(75) Inventors: Scott E. Sills, Boise, ID (US); David R. Jenkins, Boise, ID (US); David R. Hembree, Boise, ID (US)

(73) Assignee: Micron Technology, Inc., Boise, ID (US)

(*) Notice: Subject to any disclaimer, the term of this patent is extended or adjusted under 35 U.S.C. 154(b) by 1327 days.

(21) Appl. No.: 12/853,105

(22) Filed: Aug. 9, 2010

(65) Prior Publication Data

US 2012/0032182 A1 Feb. 9, 2012

(51) Int. Cl.
| | |
|---|---|
| *H01L 33/40* | (2010.01) |
| *H01L 33/48* | (2010.01) |
| *H01L 25/075* | (2006.01) |
| *H01L 23/00* | (2006.01) |
| *H01L 25/16* | (2006.01) |
| *H01L 33/60* | (2010.01) |
| *H01L 33/64* | (2010.01) |

(52) U.S. Cl.
CPC .......... *H01L 25/0753* (2013.01); *H01L 24/32* (2013.01); *H01L 24/73* (2013.01); *H01L 25/167* (2013.01); *H01L 33/60* (2013.01); *H01L 33/64* (2013.01); *H01L 2224/32225* (2013.01); *H01L 2224/48091* (2013.01); *H01L 2224/48227* (2013.01); *H01L 2224/73265* (2013.01); *H01L 2924/01322* (2013.01); *H01L 2924/12043* (2013.01)

(58) Field of Classification Search
USPC ..... 257/76, 98, E33.025, E33.067, E21.211; 438/29
See application file for complete search history.

(56) References Cited

U.S. PATENT DOCUMENTS

| | | | |
|---|---|---|---|
| 5,229,628 A | 7/1993 | Kobayashi et al. | |
| 5,316,973 A * | 5/1994 | Wang et al. | ...... 438/3 |
| 6,144,286 A * | 11/2000 | Moos et al. | ...... 338/22 R |
| 6,462,643 B1 | 10/2002 | Fujii et al. | |
| 6,580,098 B1 * | 6/2003 | Koide | ...... 257/103 |
| 7,221,044 B2 | 5/2007 | Fan et al. | |
| 7,268,372 B2 | 9/2007 | Park et al. | |
| 7,626,346 B2 | 12/2009 | Scilla | |
| 2002/0043943 A1* | 4/2002 | Menzer et al. | ...... 315/291 |
| 2005/0218419 A1* | 10/2005 | Okazaki et al. | ...... 257/98 |

(Continued)

FOREIGN PATENT DOCUMENTS

| | | |
|---|---|---|
| KR | 20100035237 A | 4/2010 |
| WO | 2010054650 A1 | 5/2010 |

OTHER PUBLICATIONS

International Search Report and Written Opinion mailed Mar. 21, 2012 in International Application No. PCT/US2011/046315, 8 pages.

*Primary Examiner* — Steven Loke
*Assistant Examiner* — Sitaramarao S Yechuri
(74) *Attorney, Agent, or Firm* — Perkins Coie LLP (57) ABSTRACT

A solid state light ("SSL"), a solid state emitter ("SSE"), and methods of manufacturing SSLs and SSEs. In one embodiment, an SSL comprises a packaging substrate having an electrical contact and a light emitting structure having a front side and a back side. The back side of the light emitting structure is superimposed with the electrical contact of the packaging substrate. The SSL can further include a temperature control element aligned with the light emitting structure and the electrical contact of the packaging substrate.

15 Claims, 6 Drawing Sheets

(56) References Cited

U.S. PATENT DOCUMENTS

| | | |
|---|---|---|
| 2006/0098438 A1 | 5/2006 | Ouderkirk et al. |
| 2007/0041185 A1 | 2/2007 | Yatsuda et al. |
| 2007/0139928 A1 | 6/2007 | Wang et al. |
| 2008/0061717 A1 | 3/2008 | Bogner et al. |
| 2008/0083929 A1 | 4/2008 | Fan et al. |
| 2009/0016047 A1* | 1/2009 | Uke et al. .................... 362/157 |
| 2009/0050907 A1* | 2/2009 | Yuan et al. .................... 257/88 |
| 2009/0085503 A1 | 4/2009 | Narita et al. |
| 2009/0153076 A1 | 6/2009 | Huang et al. |
| 2010/0078668 A1 | 4/2010 | Kim |
| 2011/0291129 A1 | 12/2011 | Wirth |

* cited by examiner

SOLID STATE LIGHTS WITH THERMAL CONTROL ELEMENTS

TECHNICAL FIELD

The present technology is related to controlling the heat generated by solid state lights ("SSLs"). Several specific embodiments of the technology are directed to SSLs having a solid state emitter ("SSE") and a thermal control element that limits the output of the SSE at higher temperatures.

BACKGROUND

SSLs use semiconductor light-emitting diodes ("LEDs"), polymer light-emitting diodes ("PLEDs"), organic light-emitting diodes ("OLEDs"), or other types of SSEs as sources of illumination. Generally, SSLs generate less heat, provide greater resistance to shock and vibration, and have longer life spans than conventional lighting devices that use filaments, plasma, or gas as sources of illumination (e.g., florescent or incandescent lights).

Figure 1A:
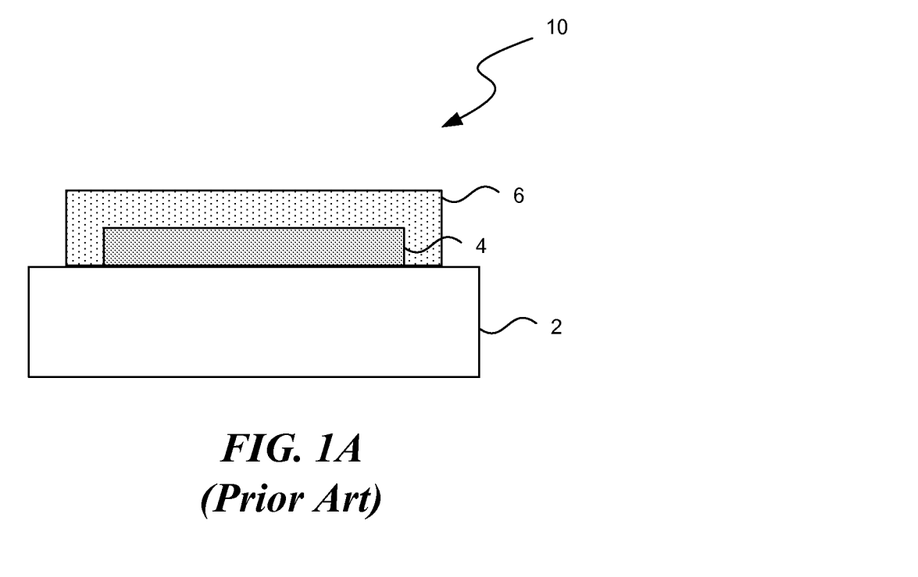
FIG. 1A is a cross-sectional view of a conventional SSL device in accordance with the prior art.

A conventional type of SSL is a "white light" SSE. White light requires a mixture of wavelengths to be perceived by human eyes. However, SSEs typically only emit light at one particular wavelength (e.g., blue light), so SSEs must be modified to emulate white light. One conventional technique for modulating the light from SSEs includes depositing a converter material (e.g., phosphor) on the SSE. For example, FIG. 1A shows a conventional SSL 10 that includes a support 2, an SSE 4 attached to the support 2, and a converter material 6 on the SSE 4. The SSE 4 can include one or more light emitting components. The SSE 4 typically emits blue light that stimulates the converter material 6 to emit light at a desired frequency (e.g., yellow light). The combination of the emissions from the SSE 4 and the converter material 6 appears white to human eyes if the wavelengths of the emissions are matched appropriately.

Figure 1B:
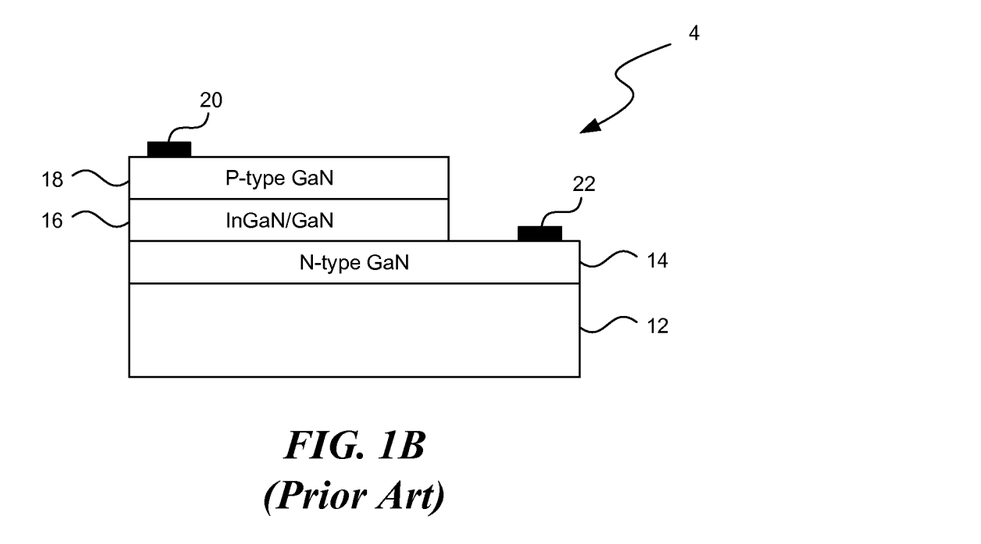
FIG. 1B is a cross-sectional view of an SSE in accordance with the prior art.

FIG. 1B shows a conventional structure for the SSE 4 that includes a silicon substrate 12, an N-type gallium nitride ("GaN") material 14, an indium gallium nitride ("InGaN") material 16 (and/or GaN multiple quantum wells), and a P-type GaN material 18 on one another in series. The SSE 4 shown in FIG. 1B is a lateral-type device that includes a first contact 20 on the P-type GaN material 18 and a second contact 22 on the N-type GaN material 14 spaced laterally apart from the first contact 20.

One challenge of conventional SSLs is that some of the components are sensitive to heat. Although SSLs produce less heat than conventional lighting devices, the heat generated by the SSEs causes such heat sensitive components to deteriorate and fail over time. For example, the phosphor and the junctions deteriorate at a faster rate at higher temperatures than at lower temperatures. The deterioration of the phosphor causes the light to change color over time, and the deterioration of the junctions reduces the light output at a given current (i.e., reduces the efficiency) and the life span of the device. Therefore, it is desirable to control the heat in the SSLs to maintain their color and intensity over a long life span.

Many SSL designs control the heat in the device by drawing heat away from the SSEs. Although this is a useful approach, it may not be possible to remove an adequate amount of heat to protect the device. Another approach is to limit the amount of heat generated by the SSEs. One conventional technique for limiting the heat generated by the SSEs is to provide an active temperature control system having a temperature sensor located in the SSL and a feedback controller that modulates the drive current to the SSE based on the signals from the temperature sensor. Such active temperature control systems increase the complexity of the SSLs and can lead to higher costs. Another existing technique for limiting the heat generated by the SSEs is to passively limit the current through the SSEs. For example, existing SSLs can have a positive temperature coefficient ("PTC") thermistor spaced laterally apart from the SSEs within the SSL package. Such laterally positioned PTC thermistors are connected to the SSEs by wirebonds. When the temperature of the SSL package increases beyond a certain threshold, the resistance of the PTC thermistor increases, which in turn reduces the current to the SSEs to limit the light output and heat. In existing passive temperature control systems, a single PTC thermistor can control the power to a plurality of separate SSEs in a multi-chip SSL.

One challenge of existing passive temperature control systems is that they have relatively slow response times because the temperature of the laterally positioned PTC thermistor lags the temperature of the SSEs. Because of such slow response times, the SSL packages can overshoot the actual maximum desired temperature before the PTC resistance has increased sufficiently to limit the light output at high temperatures, or the light output is depressed for too long before the PTC resistance decreases to increase the light output at lower temperatures. Another challenge is that the laterally spaced PTC thermistor reduces the light output per unit area because the PTC thermistors absorb some of the light and occupy space that could otherwise be occupied by an SSE. Still another drawback of existing passive temperature control systems with a single PTC thermistor that modulates a plurality of SSEs is that individual SSEs may not operate at an optimal temperature. In many multi-chip SSLs, some of the SSEs may run hotter or colder than others. The single PTC thermistor cannot compensate for such differences, and thus some of the SSEs may degrade or fail sooner than others.

DETAILED DESCRIPTION

Various embodiments of solid state lights ("SSLs") and associated methods of manufacturing SSLs are described below. The term "SSL" generally refers to "solid state light" and/or "solid state lighting" according to the context in which it is used. The terms "SSL emitter" or "solid state emitter" ("SSE") generally refer to solid state components that convert electrical energy into electromagnetic radiation in the visible, ultraviolet, infrared and/or other spectra. SSEs include "LEDs," which are semiconductor diodes that convert electrical energy into electromagnetic radiation in a desired spectrum. The term "phosphor" generally refers to a material that can continue emitting light after exposure to energy (e.g., electrons and/or photons). A person skilled in the relevant art will also understand that the technology may have additional embodiments and/or may be practiced without several of the details of the embodiments described below with reference to FIGS. 2A-7B.

Figure 2A:
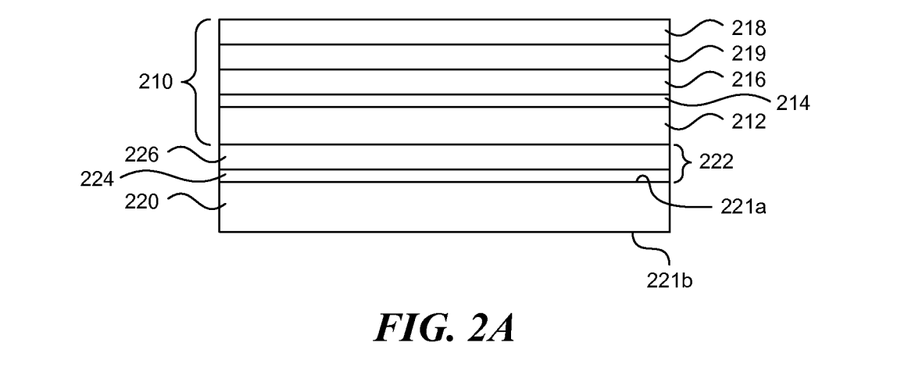
FIGS. 2A-2C are schematic cross-sectional views illustrating a process for manufacturing an SSE in accordance with embodiments of the technology.
Figure 2B:
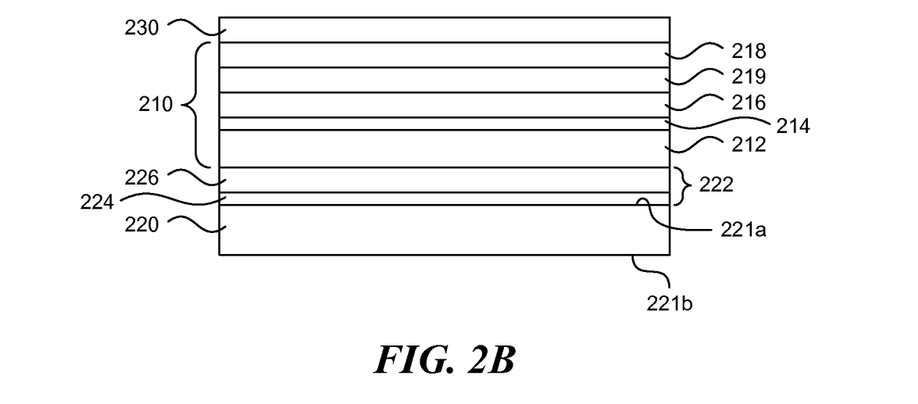
Figure 2C:
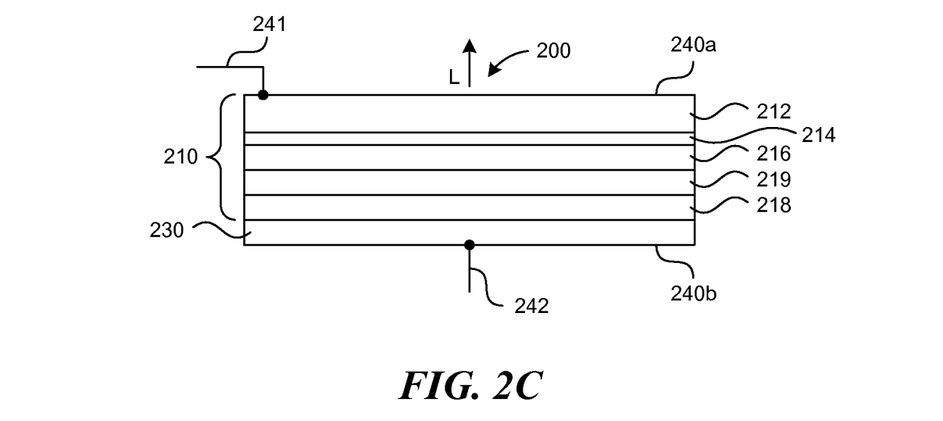

FIGS. 2A-2C are cross-sectional views illustrating a process for manufacturing an SSE 200 (FIG. 2C) in accordance with an embodiment of the technology. FIG. 2A, more specifically, illustrates a stage of the process in which a light emitting structure 210 has been formed on a substrate 220. The light emitting structure 210 can include a first semiconductor material 212, an active region 214, and a second semiconductor material 216. The first semiconductor material 212 can be an N-type semiconductor material, such as N-type gallium nitride ("N-GaN"), and the second semiconductor material can be a P-type semiconductor material, such as P-type gallium nitride ("P-GaN"). The active region 214 can be indium gallium nitride ("InGaN"). The first semiconductor material 212, active region 214, and second semiconductor material 216 can be deposited sequentially using chemical vapor deposition ("CVD"), physical vapor deposition ("PVD"), atomic layer deposition ("ALD"), plating, or other techniques known in the semiconductor fabrication arts. The light emitting structure 210 can be configured to emit light in the visible spectrum (e.g., from about 380 nm to about 750 nm), in the infrared spectrum (e.g., from about 750 nm to about 3,000 nm), and/or in other suitable spectra.

The light emitting structure 210 can optionally include a reflective material 218 attached to the second semiconductor material 216 by a transparent electrically conductive material 219. The reflective material 218 can be silver (Ag), gold (Au), copper (Cu), aluminum (Al), or any other suitable material that reflects light that was initially emitted from the active region 214 toward the second semiconductor material 216 back through the first semiconductor material 212. The reflective material 218 can also have a high thermal conductivity. The reflective material 218 can also be selected based on the color of light it reflects. For example, silver generally does not alter the color of the reflected light. When a colored light is desired, the reflective material 218 can be gold, copper or another reflective, colored surface. The transparent conductive material 219 can be indium Tin oxide (ITO) or any other suitable material that is transparent, electrically conductive, and adheres the reflective material 218 to the second semiconductor material 216. The conductive material 219 and reflective material 218 can be deposited using CVD, PVD, ALD, plating, or other techniques known in the semiconductor fabrication arts.

Referring still to FIG. 2A, the substrate 220 can have a front surface 221a and a back surface 221b, and the substrate 220 can comprise silicon (Si), sapphire, or another suitable material for forming the light emitting structure 210. In one embodiment, the substrate 220 can include silicon in which at least a portion of the silicon has the Si(1,0,0) crystal orientation at the front surface 221a. In other embodiments, the substrate 220 can include silicon with other crystal orientations (e.g., Si(1,1,1)), AlGaN, GaN, silicon carbide (SiC), sapphire ($Al_2O_3$), a combination of the foregoing materials, and/or other suitable substrate materials.

In one embodiment, a buffer structure 222 is formed on the front surface 221a of the substrate 220. As shown in FIG. 2A, the buffer structure 222 can include a first portion 224 on the front surface 221a of the substrate 220 and a second portion 226 on the first portion 224. The buffer structure 222 provides a favorable surface for growing or otherwise forming the first semiconductor material 212. The buffer structure 222 can include aluminum nitride (AlN), aluminum-gallium nitride (AlGaN), zinc nitride (ZnN), and/or other suitable materials formed via metal-organic CVD ("MOCVD"), molecular beam epitaxy ("MBE"), liquid phase epitaxy ("LPE"), hydride vapor phase epitaxy ("HVPE"), and/or other suitable techniques. For example, the first portion 224 can be AlN and the second portion 226 can be AlGaN. In further embodiments, the buffer structure 222 may be omitted. For example, the buffer structure 222 may be omitted when the substrate 220 surface is suitable for forming the first semiconductor material 212.

FIG. 2B illustrates a subsequent stage of the process in which a temperature control element 230 is formed on the reflective material 218. The embodiment of the temperature control element 230 shown in FIG. 2B is a passive temperature control feature integrated vertically with the light emitting structure 210. As a result, the temperature control element 230 is heated by the light emitting structure 210 via direct conduction through the transparent conductive material 219 and the reflective material 218. The temperature control element 230 can comprise a positive temperature coefficient ("PTC") thermistor material that changes its electrical conductivity in response to changes in temperature. The PTC thermistor material can comprise a polymeric or ceramic-based material that increases the electrical resistance in select temperature ranges that correspond to the maximum desired operating temperatures of the SSE. In one embodiment, the temperature control element 230 can comprise barium titanate deposited on the reflective material 218 using PVD or another suitable deposition technique. Other embodiments of the PTC thermistor material can comprise crystalline polymers or blends of crystalline polymers and electrically conductive fillers. As explained in more detail below, the temperature control element 230 inherently limits the electrical current at higher temperatures to regulate the light output in a manner that maintains the operating temperature in a desired range.

FIG. 2C illustrates a subsequent stage of the process in which the SSE 200 is formed by removing the substrate 220 and the buffer structure 222 from the first semiconductor material 212. The substrate 220 and buffer structure 222 can be removed using back grinding, etching, or other suitable processes known in the art. In the embodiment illustrated in FIG. 2C, the SSE 200 is inverted so that the first semiconductor material 212 faces in the direction of the light "L." The first semiconductor material 212 accordingly defines a front side 240a and the temperature control element 230 defines a back side 240b of the SSE 200. In some embodiments, an additional conductor material, e.g., tungsten (not shown), may be deposited on/over the temperature control element 230 such that the additional conductor material defines the back side 240b of the SSE 200. A first contact 241 can be wire-bonded or otherwise attached to the first semiconductor material 212, and a second contact 242 can be surface-mounted to the temperature control element 230. The first and second contacts 241 and 242 can be electrically coupled to a carrier substrate (not shown in FIG. 2C) and/or a package substrate (not shown in FIG. 2C) to provide power to the light emitting structure 210.

In operation, the resistance of the temperature control element 230 increases as the temperature of the light emitting structure 210 increases. The increased resistance of the temperature control element 230 at higher temperatures reduces the potential drop across the light emitting structure 210, thereby reducing the current through the device and the corresponding power dissipated by the device. This reduces the amount of heat generated by the light emitting structure 210 to avoid overheating conditions that can rapidly deteriorate the heat sensitive components. The temperature of the light emitting structure 210 can decrease when the temperature control element 230 has a high resistance, and as the temperature decreases, the resistance of the temperature control element 230 decreases to increase the light output. As such, the temperature control element 230 self-modulates the light output and temperature of the light emitting structure 210 to maintain the temperature of the SSE 200 within a desired operating range.

Figure 3A:
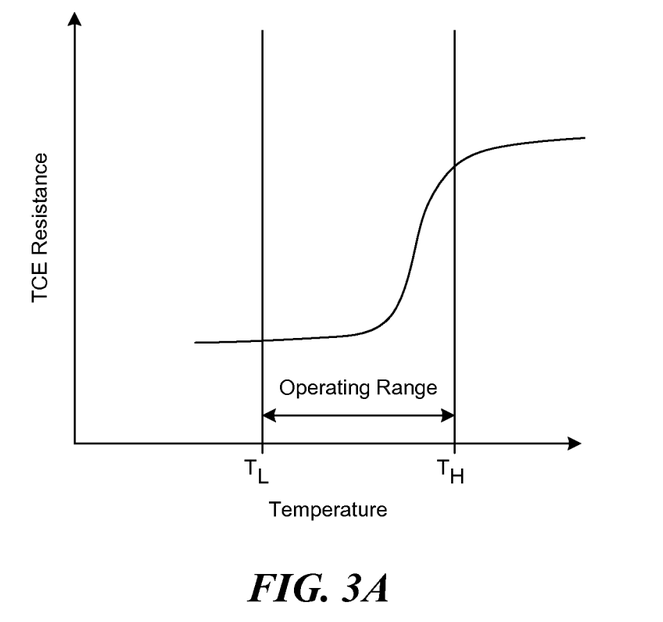
FIGS. 3A and 3B are graphs showing the relationship between the resistance of a temperature control element and the temperature of an SSE in accordance with embodiments of the technology.
Figure 3B:
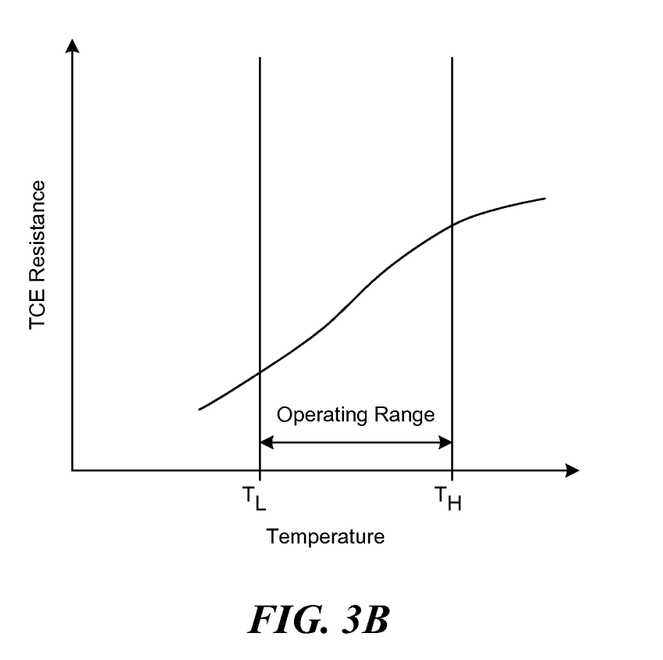

FIGS. 3A and 3B are graphs showing embodiments of the relationship between the resistance of the temperature control element 230 and the temperature of the SSE 200. The SSE 200 has an operating temperature range between a low temperature ($T_L$) and a high temperature ($T_H$). In the embodiment illustrated in FIG. 3, the resistance of the temperature control element 230 remains fairly constant through a significant portion of the operating temperature range and then rapidly increases as the temperature reaches the high temperature $T_H$ of the operating range. This embodiment accordingly allows the light emitting structure 210 (FIG. 2) to emit a constant, high light output throughout most of the operating range, but then rapidly reduce the light output as the temperature nears the high temperature $T_H$. FIG. 3B illustrates an alternative embodiment in which the resistance of the temperature control element 230 steadily increases as the temperature increases from $T_L$ to $T_H$. The embodiment illustrated in FIG. 3B accordingly decreases the light output at lower temperatures than the embodiment illustrated in FIG. 3A to provide a more gradual change in the light output and a more gradual change in the heat output.

One advantage of several embodiments of the SSE 200 described with respect to FIGS. 2A-2C is that the temperature control element 230 responds very quickly to changes in temperature because the temperature control element 230 is formed integrally with the light emitting structure 210. This enables the heat from the light emitting structure 210 to be conductively transferred to the temperature control element 230 over a very short distance and through materials that have high thermal conductivities. As a result, the temperature control element 230 can quickly decrease the light output before the temperature of the light emitting structure 210 exceeds the high temperature $T_H$ of the desired operating temperature range. In contrast to several embodiments of the SSE 200, conventional passively controlled SSLs have relatively slower response times because their PTC thermistors are spaced laterally apart from the SSEs such that the heat transferred to such lateral PTC thermistors is generally limited to convection heating, radiant heating, or conductive heating through longer distances and/or materials that have lower thermal conductivities than those of the SSE 200. As such, SSEs in accordance with several embodiments of new technology have much faster response times and provide better control of the SSE temperatures compared to conventional passively controlled systems.

Figure 4A:
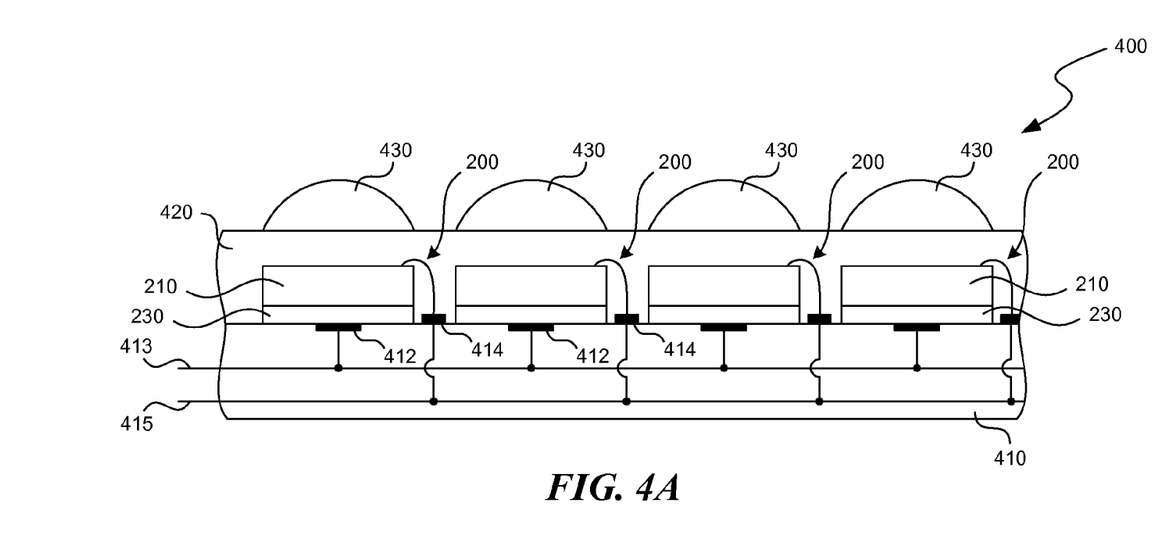
FIG. 4A is a schematic cross-sectional view of an SSL having a plurality of SSEs in accordance with embodiments of the technology.

FIG. 4A is a cross-sectional view of an SSL 400 having a plurality of SSEs 200 in accordance with an embodiment of the technology. The SSL 400 can include a package substrate 410 that includes first contacts 412 coupled to first leads 413 and second contacts 414 coupled to second leads 415. The first contacts 412 can be positive terminals and the second contacts 414 can be negative terminals. The individual SSEs 200 are mounted to the package substrate 410 such that the individual temperature control elements 230 are superimposed with a corresponding first contact 412 of the package substrate 410. In the embodiment illustrated in FIG. 4, each temperature control element 230 is thus directly between a light emitting structure 210 and a corresponding first contacts 412. The individual temperature control elements 230 are accordingly configured such that heat transfers conductively from the light emitting structures 210 to the temperature control elements 230. The heat transfers from the temperature control element 230 to the package substrate 400. As such, the connection to the package substrate 400 and the package substrate itself should be thermally conductive. For example, a eutectic Au/Sn material with a thin layer of an adhesion promoter (e.g., titanium) under the Au/Sn material may be used. The SSEs can be reflowed to solder the SSEs to a metallic die attach pad in a package or on a substrate to create a robust electrical and thermal conduction path from the SSE to the substrate. The SSL 400 can further include a converter material 420 covering at least a portion of the SSEs 200 and one or more light conditioning elements 430 aligned with corresponding SSEs 200.

Figure 4B:
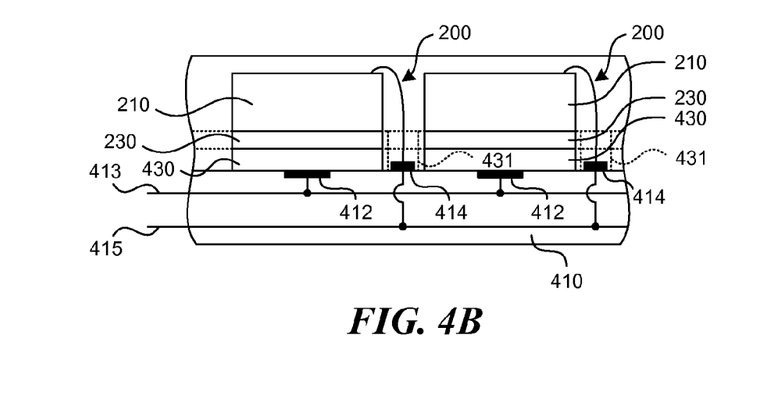
FIG. 4B is a schematic cross-sectional view of an SSL having a plurality of SSEs in accordance with embodiments of the technology.

FIG. 4B is a cross-sectional view illustrating another embodiment in which the temperature control element 230 is built on or within a separate die 430 that is sandwiched between the light emitting structure 210 rather than integrating the temperature control element 230 into the light emitting structure 210 or the substrate 400. For example, the temperature control element 230 could be formed on and/or in the separate die 430 apart from the light emitting structure 210, and then the die 430 with the temperature control element 230 can be attached to one of the light emitting structure 210 or the substrate 400. The die 430 could be larger than a single light emitting structure 210 such that multiple light emitting structures 210 could be mounted to a single, large die 430 (shown in dashed lines) with a continuous temperature control element 230 (shown in dashed lines) or discrete temperature control elements 230 under each light emitting structure 210 (shown in solid lines). Such a large die 430 and temperature control element 230 could be patterned with a number of wirebond apertures 431 (shown in dashed lines) to access the contacts 414. The topmost layer of the temperature control element 430 could be metallized (preferably with either Au or Ag) to provide a mirror that reflects light upward from areas between the light emitting structures 210, rather than the light being partially absorbed by the substrate or package.

Several embodiments of SSLs 400 in accordance with the technology also optimize the light output per unit area and provide one-to-one modulation of the SSEs 200. As mentioned above, one challenge of conventional passively controlled SSLs is that the laterally spaced PTC thermistor reduces the light output per unit area because such lateral PTC thermistors absorb some of the light. Several embodiments of the SSL 400, however, locate the temperature control elements 230 directly between the light emitting structures 210 and the package substrate 410 such that more space of the package substrate 410 can be occupied by the SSEs 200 instead of the light absorbing PTC thermistors. Also, each SSE 200 of the SSL 400 can be controlled by an individual temperature control element 230 so that each SSE 200 can operate at its optimal temperature. This is expected to prolong the life of more SSEs in a multi-chip SSL.

The package substrate 410 of any of the foregoing embodiments of the technology can be a printed circuit board having traces that define leads for providing power to the SSEs 200. In an alternative embodiment, the package substrate 410 can be a base made from copper, aluminum, or another type of material that has a first portion defining either an anode or a cathode, and a second portion electrically isolated from the first portion that defines the other of the cathode or anode. In still other embodiments, the package substrate 410 can have a base made from ceramic or another suitable dielectric material and traces on the base. The front surface of the package substrate 410 can be flat, or in other embodiments the package substrate 410 can include a plurality of depressions in which one or more of the SSEs 200 are positioned. The depressions, for example, can be cavities sized and shaped to receive a single SSE 200. Suitable package substrates 410 for the SSL 400 are shown and described in commonly owned U.S. application Ser. No. 12/732,046, entitled "Multi-Lens Solid State Lighting Devices," filed on Mar. 25, 2010, and published as U.S. Application Publication No. 2011/0235306, which is incorporated herein by reference.

The optional converter material 420 of any of the foregoing embodiments (e.g., FIG. 4) is selected to emit light at a wavelength that combines with the light from the SSEs 200 to create a desired color of light. The converter material 420, for example, can have a composition that emits light at a desired wavelength under stimulation such that the combination of the emissions from the SSEs 200 and the converter material 420 emulates white light. For example, in one embodiment, the converter material 420 can include a phosphor containing cerium(III)-doped yttrium aluminum garnet ("YAG") at a particular concentration for emitting a range of colors including green, yellow and/or red under photoluminescence. In other embodiments, the converter material 430 can include neodymium-doped YAG, neodymium-chromium double-doped YAG, erbium-doped YAG, ytterbium-doped YAG, neodymium-cerium double-doped YAG, holmium-chromium-thulium triple-doped YAG, thulium-doped YAG, chromium(IV)-doped YAG, dysprosium-doped YAG, samarium-doped YAG, terbium-doped YAG, and/or other suitable phosphor compositions. When light and/or energized particles from the SSEs 200 irradiate the converter material 420, the phosphor is energized and emits light with desired characteristics.

The light conditioning elements 430 of any of the foregoing embodiments (e.g., FIG. 4) are optional and can be lenses configured to focus the light or a diffuser that diffuses the light. The conditioning elements 430 can include a transmissive material made from silicone, polymethylmethacrylate (PMMA), resin, or other materials with suitable properties for transmitting the radiation emitted by the SSEs 200. The conditioning elements 430 can optionally include a converter material, such as phosphor, that emits light at a different frequency to produce the perception of white light or another desired color to the human eye. The converter material in the conditioning elements 430 can be in addition to or in lieu of the converter material 420.

Figure 5:
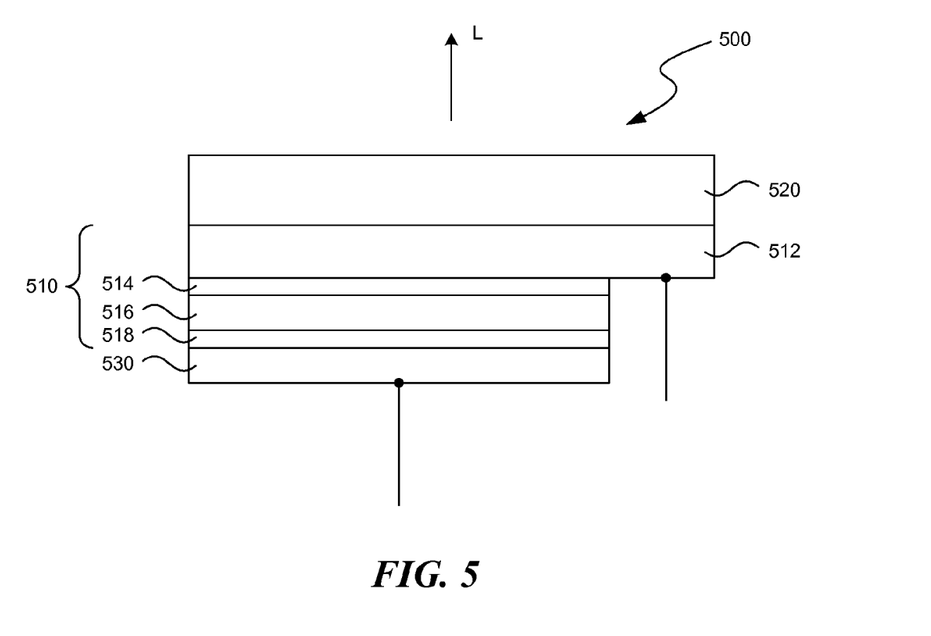
FIG. 5 is a schematic cross-sectional view of an SSE in accordance with another embodiment of the technology.

FIG. 5 is a schematic cross-sectional view of an SSE 500 having a light emitting structure 510 and a substrate 520 in accordance with another embodiment of the technology. The light emitting structure 510 can be a stack having a first semiconductor material 512, an active region 514, and a second semiconductor material 516. The first and second semiconductor materials 512 and 516 can comprise N-GaN and P-GaN, respectively. The active region 514 can be InGaN or another quantum well structure known in the art. In the embodiment illustrated in FIG. 5, the substrate 520 is transparent to the radiation emitted by the light emitting structure 510. As such, the light emitting structure 510 can be grown on the substrate 520 without having to remove the substrate 520 at a later stage of the fabrication process. The substrate 520, for example, can comprise sapphire or another suitably transparent material on which the light emitting structure 510 can be formed. The SSE 500 further includes a reflective material on the backside of the second semiconductor material 516 and a temperature control element 530. The temperature control element 530 can be a PTC thermistor material or another suitable material that operates in a manner similar to the temperature control element 230 described above with reference to the SSE 200.

Figure 6:
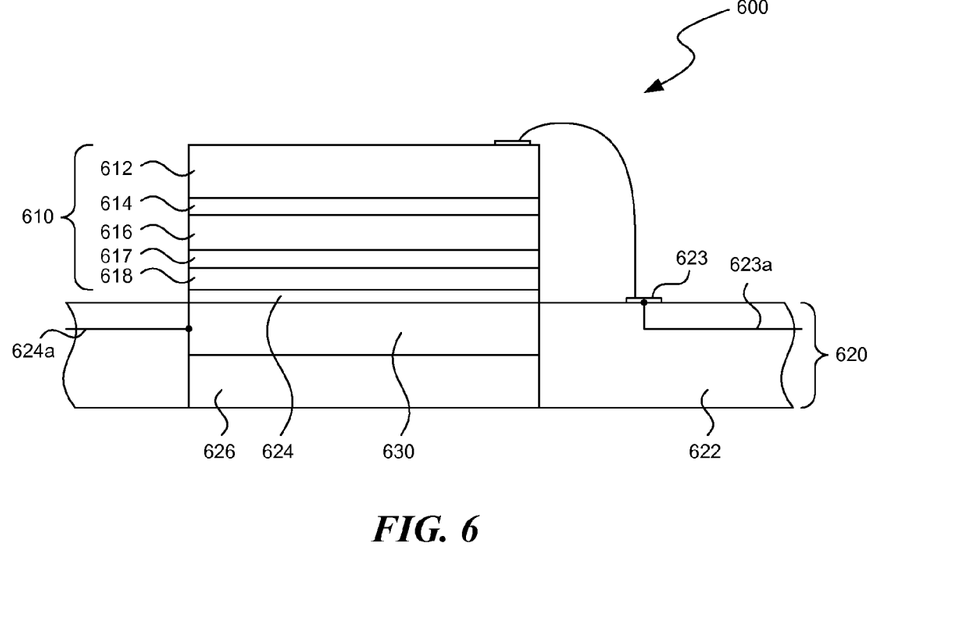
FIG. 6 is a schematic cross-sectional view of an SSL having an SSE and a packaging substrate in accordance with another embodiment of the technology.

FIG. 6 is a schematic cross-sectional view of an SSL 600 having an SSE 610 and a packaging substrate 620 in accordance with another embodiment of the technology. The SSE 610 can be a light emitting structure having a first semiconductor material 612 (e.g., N—GaN), an active region 614 (e.g., InGaN), and a second semiconductor material 616 (e.g., P-GaN). The SSE 610 can further include a transparent conductive material 617 and a reflective material 618. The SSE 610 can accordingly be similar to the light emitting structure 210 described above with reference to FIG. 2C, but the SSE 610 does not include a temperature control element integrated into the SSE 610 itself. Instead, the packaging substrate 620 can have a base material 622, a first contact 623 coupled to a first lead 623a, a second contact 624 coupled to a second lead 624a, and a temperature control element 630 integrated into the packaging substrate 620. The temperature control element 630 can be superimposed or otherwise aligned with the second contact 624a of the packaging substrate 620 and the back side of the SSE 610. The SSL 600 can further include a heat sink 626 at the back side of the temperature control element 630 to dissipate heat from the SSL 600. In other embodiments, the packaging substrate 620 can have an open cavity behind the temperature control element 630 instead of the heat sink 626, or the back side of the temperature control element 630 can be embedded in the base material 622. The SSL 600 operates in a manner similar to the SSL 400 described above, but the SSL 600 increases the resistance in the packaging substrate 620 instead of onboard the SSE 610 itself.

Figure 7A:
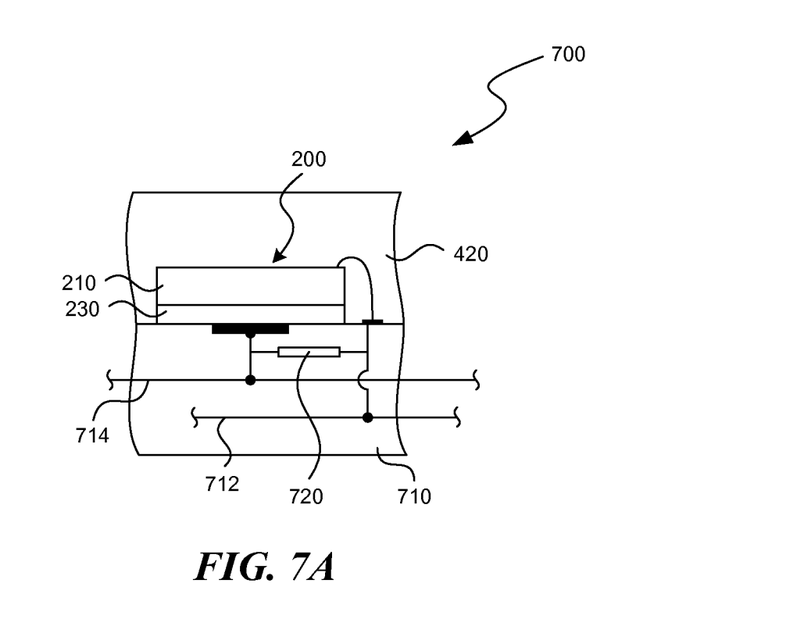
FIG. 7A is a schematic cross-sectional view of an SSL having an SSE and a packaging substrate in accordance with another embodiment of the technology.
Figure 7B:
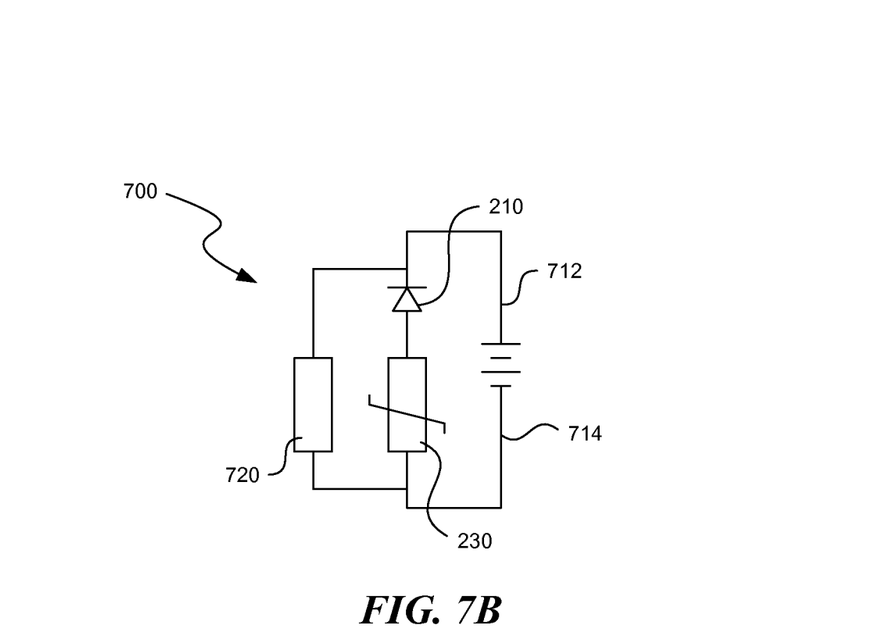
FIG. 7B is a circuit diagram of the SSL in FIG. 7A.

FIG. 7A is a schematic side view of an SSL 700 and FIG. 7B is a circuit diagram of the SSL 700 in accordance with another embodiment of the technology. The SSL 700 has several components that can be the same as those described above, and thus like reference numbers refer to like components in FIGS. 2A-7B. In one embodiment, the SSL 700 has at least one SSE 200 and a packaging substrate 710 (FIG. 7A). The SSE 200 can have the light emitting structure 210 and the temperature control element 230 integrated with the light emitting structure 210, as described above, or the SSE can be any of the embodiments shown in FIGS. 5 and 6. The packaging substrate 710 can have a first lead 712 coupled to one contact of the SSE 200, a second lead 714 coupled to the other contact of the SSE 200, and a bypass device 720 coupled to the first and second leads 712 and 714 in parallel with the SSE 200. The bypass device 720 can be a resistor, a Zenner diode, or other suitable device that has a resistance $R_{bp}$. In operation, the temperature control element 230 generates heat as its resistance increases in response to the increasing temperature of the light emitting structure 210. The heat generated by the temperature control element 230 can itself contribute to the thermal deterioration of the SSL 700. Thus, when the resistance of the temperature control element 230 exceeds $R_{bp}$, the current preferentially flows through the bypass device 720 to avoid overheating the SSL 700.

From the foregoing, it will be appreciated that specific embodiments of the invention have been described herein for purposes of illustration, but that various modifications may be made without deviating from the spirit and scope of the invention. For example, any of the features of the embodiments of the SSLs and SSEs shown in FIGS. 2A-7B can be interchanged and matched together to provide the desired light intensity distribution. Accordingly, the invention is not limited except as by the appended claims.

We claim:

1. A solid state light ("SSL"), comprising:
a packaging substrate having an electrical contact;
a light emitting structure having—
   a first semiconductor material and a second semiconductor material with an active region therebetween;
   a reflective material proximate the second semiconductor material; and
   a temperature control element positioned between the light emitting structure and the electrical contact of the packaging substrate, wherein the temperature control element comprises a positive temperature coefficient ("PTC") material contacting the reflective material such that the temperature control element is integrated directly with the light emitting structure.

2. The SSL of claim 1, wherein the temperature control element is surface-mounted to the electrical contact of the packaging substrate.

3. The SSL of claim 2, wherein the first semiconductor material is an N-type semiconductor material and the second semiconductor material is a P-type semiconductor material.

4. The SSL of claim 3, wherein:
the N-type semiconductor material is N-type gallium nitride (N-GaN);
the P-type semiconductor material is P-type gallium nitride (P-GaN); and
the active region comprises indium gallium nitride (InGaN).

5. The SSL of claim 1, wherein the PTC material comprises barium titanate.

6. The SSL of claim 1, wherein the temperature control element is integrated directly with the light emitting structure.

7. The SSL of claim 1, wherein a heat sink is attached to the temperature control element.

8. The SSL of claim 1, further comprising a bypass device electrically coupled to the light emitting structure and the temperature control element.

9. The SSL of claim 8, wherein the bypass device is coupled in parallel with the light emitting structure and the temperature control element.

10. The SSL of claim 1, wherein:
the first semiconductor material and a second semiconductor material are configured to generate light; and
the temperature control element is surface-mounted to the electrical contact of the packaging substrate.

11. The SSL of claim 10, wherein the light emitting structure further comprises a transparent substrate between the second semiconductor material and the reflective material.

12. The SSL of claim 1, further comprising a separate die between the light emitting structure and the packaging substrate, wherein the temperature control element is formed in and/or on the separate die.

13. A solid state emitter ("SSE"), comprising:
a light emitting structure having at least a P-type semiconductor material, an N-type semiconductor material, and a reflective material adjacent the P-type semiconductor material; and
an integrated temperature control element bonded directly to the reflective material, wherein the temperature control element is configured to increase electrical resistance with increasing temperature; and
wherein the temperature control element comprises a positive temperature coefficient ("PTC") material.

14. The SSE of claim 13, wherein:
the temperature control element is vertically aligned directly with the P-type semiconductor material; and
the temperature control element is surface-mounted to the electrical contact of a packaging substrate to which the SSE is mounted.

15. The SSE of claim 13, further comprising:
a transparent conductive material between the P-type semiconductor material and the reflective material.

* * * * *